United States Patent [19]

Hamilton et al.

[11] Patent Number: 5,515,910

[45] Date of Patent: May 14, 1996

[54] APPARATUS FOR BURN-IN OF HIGH POWER SEMICONDUCTOR DEVICES

[75] Inventors: Harold E. Hamilton, Minneapolis; Brian R. Bloch, Cedar; James R. Zimmer, Cologne, all of Minn.

[73] Assignee: Micro Control System, Minneapolis, Minn.

[21] Appl. No.: 56,675

[22] Filed: May 3, 1993

[51] Int. Cl.[6] .................................................. F25B 29/00
[52] U.S. Cl. ...................... 165/30; 165/104.33; 165/908; 165/64; 165/80.4; 324/760
[58] Field of Search ............................... 165/104.33, 908, 165/30, 64, 61, 80.4; 324/760

[56] References Cited

U.S. PATENT DOCUMENTS

| | | | |
|---|---|---|---|
| 2,643,282 | 6/1953 | Greene | 174/15 |
| 3,444,308 | 5/1969 | Narbut | 174/15 |
| 3,756,903 | 9/1973 | Jones | 165/80.4 |
| 3,993,123 | 11/1976 | Chu et al. | 165/104.33 |
| 4,350,838 | 9/1982 | Harrold | 174/15 R |
| 4,352,392 | 10/1982 | Eastman | 106/104.25 |
| 4,386,650 | 6/1983 | Moen | 165/30 |
| 4,729,424 | 3/1988 | Mizuno et al. | 165/30 |
| 4,745,354 | 5/1988 | Fraser | 324/73 R |
| 4,750,086 | 6/1988 | Mittal | 361/382 |
| 4,881,591 | 11/1989 | Rignall | 165/64 |
| 4,897,762 | 1/1990 | Daikoku et al. | 361/382 |
| 4,912,600 | 3/1990 | Jaeger et al. | 361/385 |
| 4,984,628 | 1/1991 | Uchida et al. | 165/64 |
| 5,004,973 | 4/1991 | Taraci et al. | 324/158 R |
| 5,115,858 | 5/1992 | Fitch et al. | 165/1 |
| 5,126,656 | 6/1992 | Jones | 324/760 |
| 5,164,661 | 11/1992 | Jones | 324/760 |
| 5,278,495 | 1/1994 | Beaton et al. | 165/80.4 |
| 5,285,351 | 2/1994 | Ikeda | 165/104.33 |
| 5,348,076 | 9/1994 | Asakawa | 165/34 |
| 5,349,831 | 9/1994 | Daikoku et al. | 165/908 |

FOREIGN PATENT DOCUMENTS 480750  4/1992  European Pat. Off. .

OTHER PUBLICATIONS

Proceedings of the International Symposium on Cooling Technology for Electronic Equipment Mar. 17–21, 1987 Honolulu, Hawaii, pp. 110–125.

Article entitled "Experimental Investigation of Single Phase Multi–Jet Impingement Cooling of an Array of Microelectronic Heat Sources", by L. J. Jiji et al., *Department of Mechanical Engineering, The City College of The City University of New York, New York, NY 10031*.

Article entitled "Cooling of a Multichip Electronic Module by Means of Confined Two–Dimensional Jets of Dielectric Liquid", by D. C. Wadsworth et al., *The American Society of Mechanical Engineers*, Reprinted from HTD–vol. 111 heat Transfer in Electronics Editor; R. K. Shah, Book No. H00503–1989.

*Primary Examiner*—John K. Ford
*Attorney, Agent, or Firm*—Westman, Champlin & Kelly

[57] ABSTRACT

A thermal control system for use with a burn-in system, the thermal control system capable of delivering a thermally preconditioned liquid to a plurality of semiconductor devices during burn-in. The thermal control system comprises a liquid reservoir containing a liquid, a pump, and a plurality of spray nozzle arrays. The liquid contained in the liquid reservoir is thermally preconditioned through the use of a heating element and a cooling element and the temperature of the liquid provided to each spray nozzle array is individually controlled through the use of a pipe heating element. The liquid is collected and returned to the liquid reservoir after being sprayed on the semiconductor devices.

10 Claims, 3 Drawing Sheets

APPARATUS FOR BURN-IN OF HIGH POWER SEMICONDUCTOR DEVICES

BACKGROUND OF THE INVENTION

The present invention relates to the burn-in of high power semiconductor devices and, in particular, to an apparatus that is capable of controlling the temperature of high power semiconductor devices during burn-in.

The continuing miniaturization of electronic circuit components has resulted in the creation of semiconductor devices having extremely high power densities. During the burn-in of such devices, power dissipation is a major concern as the devices often generate a great deal of heat. A further concern regarding the burn-in of high power semiconductor devices is that individual devices in a single lot often have power dissipations which vary by a substantial amount. The amount of cooling each individual device needs during burn-in will therefore vary.

One way in which semiconductor devices have been cooled during burn-in is through the continual circulation of air through the burn-in chamber. While this method may be adequate for the burn-in of ordinary semiconductor devices, it is not adequate for dissipating the heat generated by high power semiconductor devices during burn-in.

Another way in which semiconductor devices have been cooled during burn-in is through direct immersion in a dielectric liquid. While more effective in cooling high power-semiconductor devices than forced air circulation, direct immersion presents many practical problems such as the difficult task of lowering the burn-in board into the liquid.

In addition to their many problems, none of the above described methods for cooling semiconductor devices during burn-in is capable of sensing the temperature of each individual semiconductor device and providing a corresponding degree of cooling for that device.

SUMMARY OF THE INVENTION

The present invention provides a thermal control system which utilizes a liquid spray to control the temperature of high power semiconductor devices during burn-in.

The thermal control system of the present invention can be adapted to be used in a conventional burn-in system and comprises a liquid reservoir containing a liquid, a pump, and a plurality of spray nozzle arrays. Each spray nozzle array comprises a plurality of spray nozzles and is located in the burn-in chamber of the burn-in system so that it faces one of the semiconductor devices. A plurality of pipes enables the liquid to be delivered from the liquid reservoir to each of the spray nozzle arrays.

The temperature of the liquid in the liquid reservoir is controlled through the operation of a heating element and a cooling element attached to the reservoir. The temperature of the liquid provided to each spray nozzle array can be further controlled by a plurality of pipe heating elements attached to the pipes. A controller receives temperature sensor signals from suitably positioned sensors and controls the operation of the heating, cooling and pipe heating elements.

In operation, the pump draws the liquid from the liquid reservoir and pumps it through a manifold into a plurality of discharge pipes. The liquid then passes through the discharge pipes, each of which is connected to a spray nozzle array, and is sprayed on the semiconductor devices. The temperature of the liquid in the liquid reservoir is maintained at a desired temperature by the heating and cooling elements and the temperature of the liquid sent to each of the spray nozzle arrays is individually controlled by the pipe heating elements, one of which is attached to each discharge pipe.

DETAILED DESCRIPTION OF THE PREFERRED EMBODIMENTS

Figure 1:
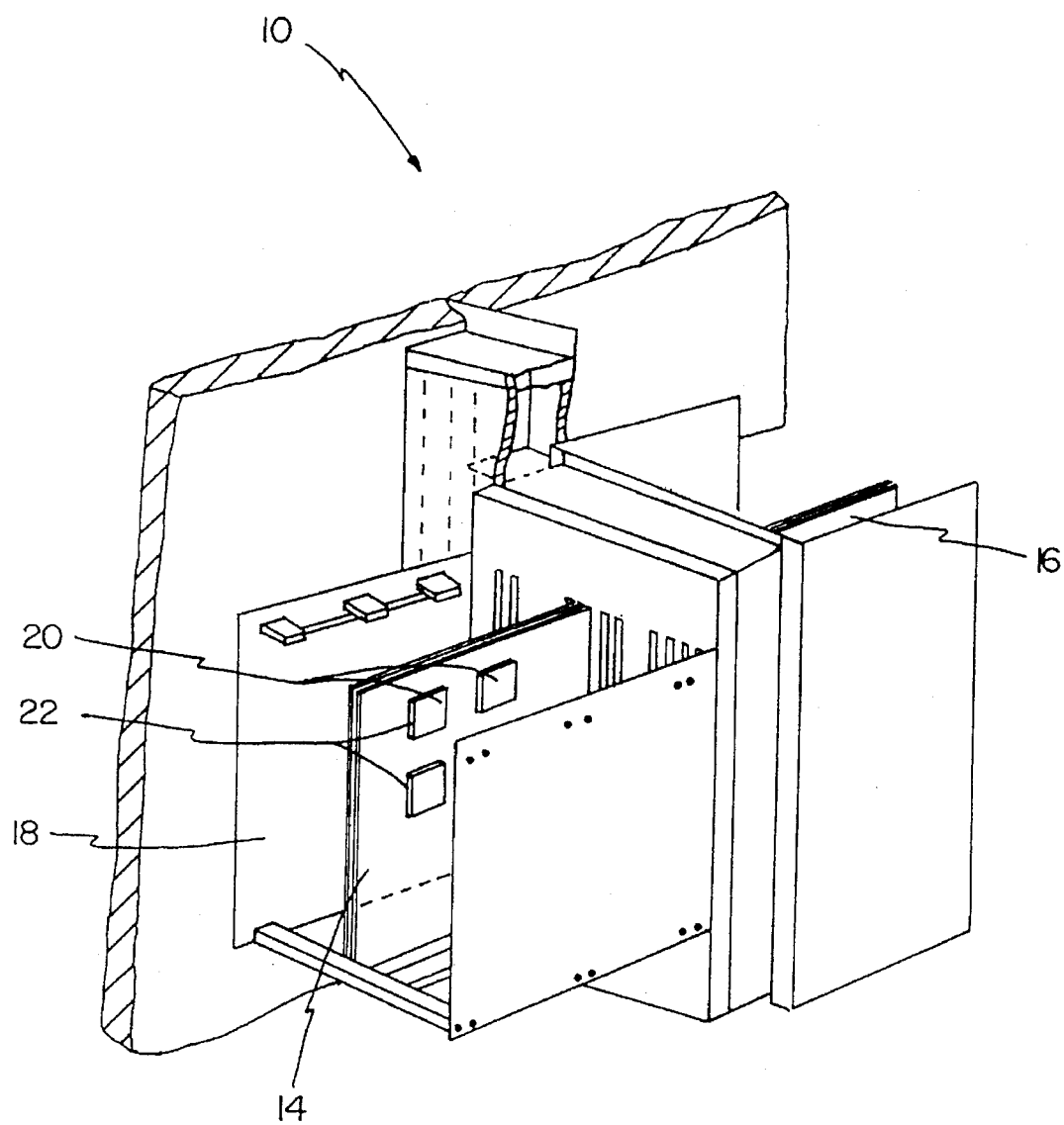
FIG. 1 is a perspective view of a portion of a typical burn-in system in which the thermal control system of the present invention is used.

FIG. 1 shows a portion of a burn-in system 10 in which a thermal control system 12 of the present invention can be used. The burn-in system 10 comprises a plurality of burn-in boards 14, each of which extends from a driver/receiver board 16 into a burn-in chamber 18. A plurality of semiconductor devices 20 to be burned-in are mounted in sockets 22 on the burn-in boards 14.

Figure 2:
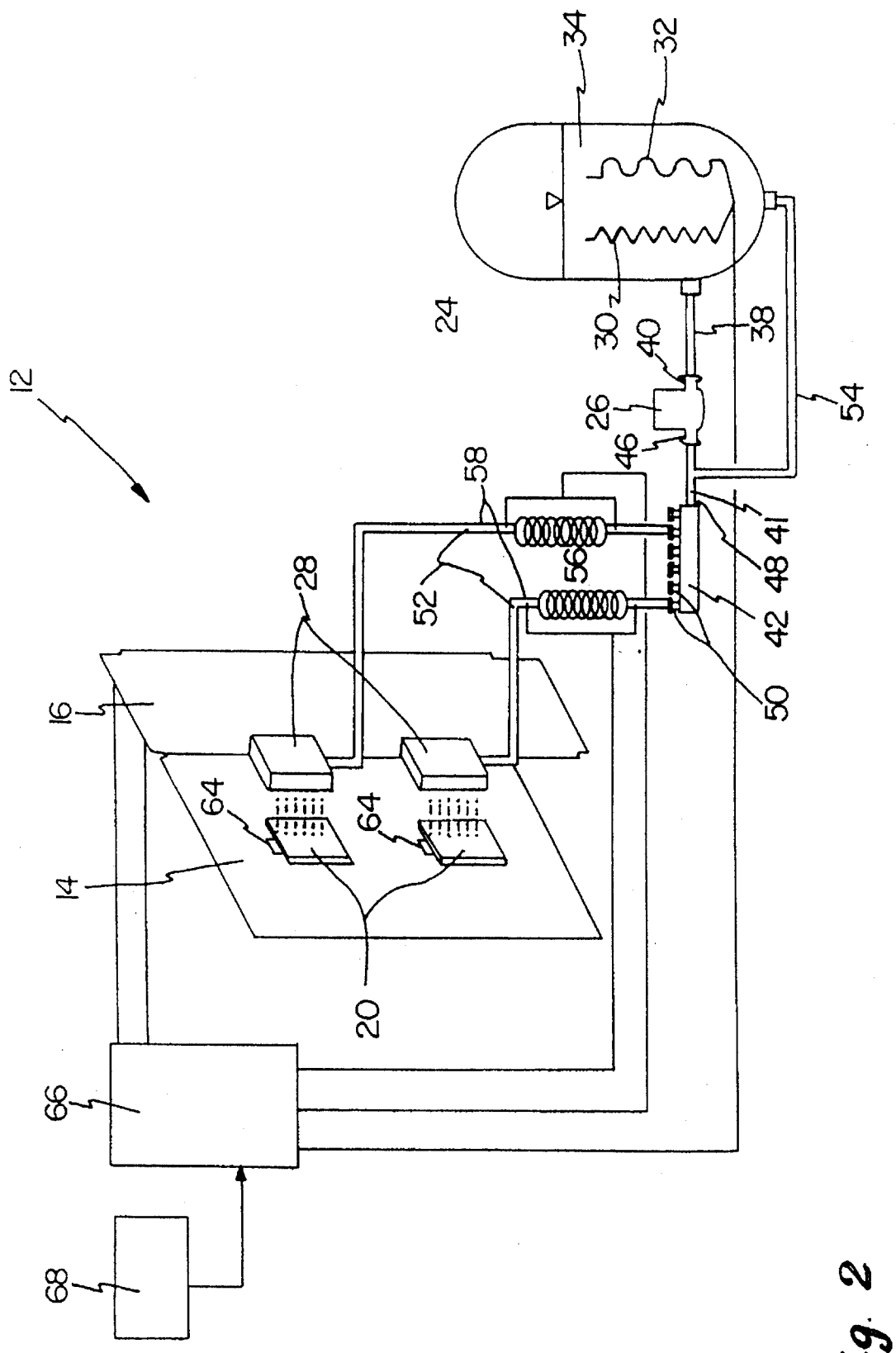
FIG. 2 is a schematic diagram of a portion of the thermal control system of the present invention.
Figure 3:
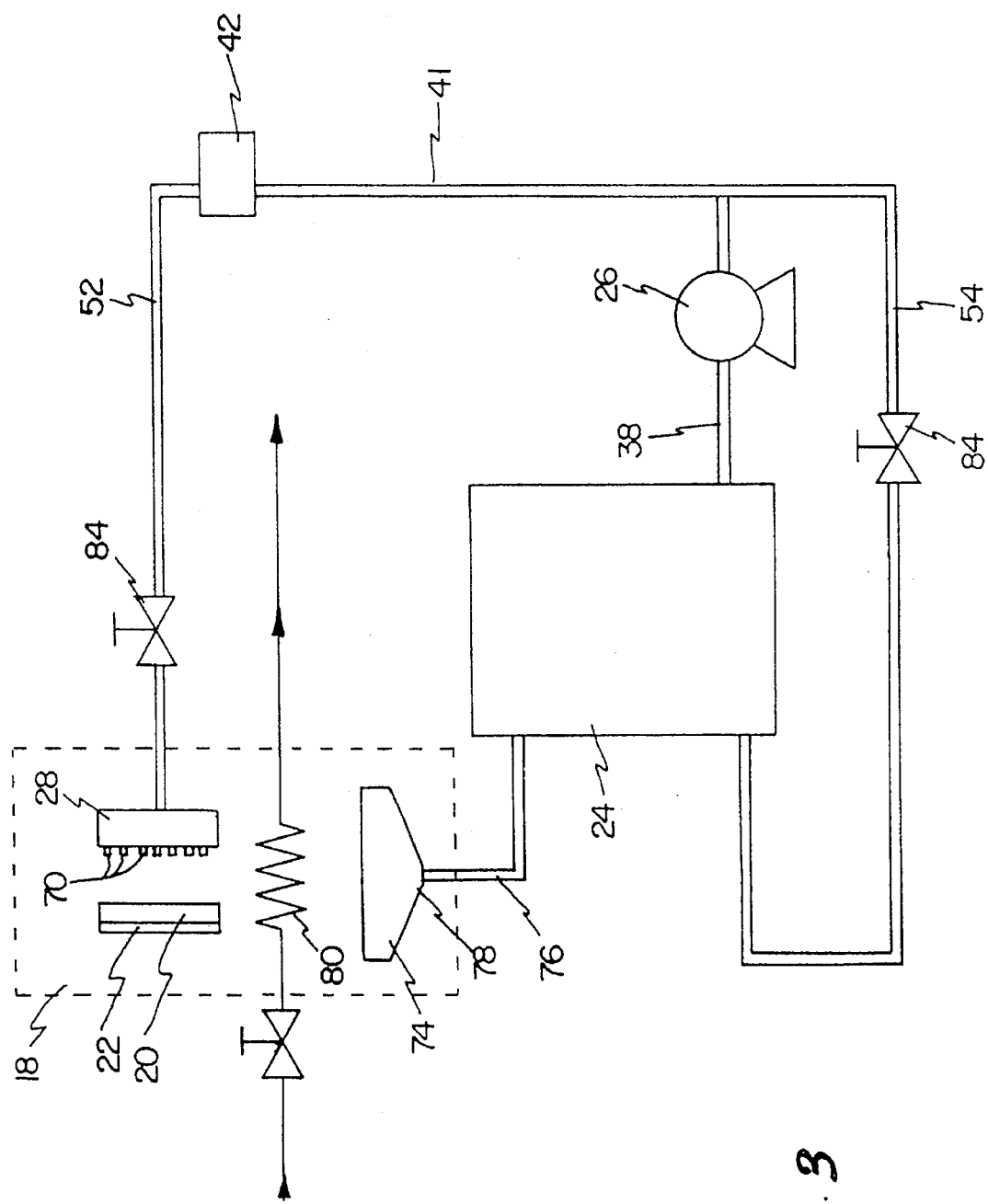
FIG. 3 is a schematic diagram of a portion of the thermal control system of the present invention.

The thermal control system 12, shown in FIG. 2, is used to control the temperature of the semiconductor devices 20 during burn-in and comprises a liquid reservoir 24, a pump 26, and a plurality of spray nozzle arrays 28. One of the spray nozzle arrays 28 is provided for each socket 22 in which a semiconductor device 20 can be mounted. A heating element 30 and a cooling element 32 are used to thermally precondition a liquid 34 contained in the liquid reservoir 24.

A first pipe section 38 connects the liquid reservoir 24 to the pump 26 and extends from the reservoir 24 to an inlet 40 of the pump 26. A second pipe section 41 connects the pump 26 to a manifold 42 and extends from an outlet 46 of the pump 26 to an inlet 48 of the manifold 40. The manifold 42 has a plurality of outlets 50 which are connected to the spray nozzle arrays 28 by a plurality of discharge pipes 52, each of which extends between one of the outlets 50 of the manifold 42 and one of the spray nozzle arrays 28. A third pipe section 54 extends from the outlet 46 of the pump 26 back to the liquid reservoir 24.

A pipe heating element 56 is attached to an outer surface 58 of each of the discharge pipes 52. The pipe heating elements 56 are used to individually adjust the temperature of the liquid 34 flowing through each discharge pipe 52 so that the temperature of the liquid 34 provided to each spray nozzle array 28 can be individually controlled.

The surface temperature of each of the semiconductor devices 20 is measured by one of a plurality of thermocouples 64 which are attached to the burn-in boards 14. Each thermocouple 64 is placed adjacent to one of the semiconductor devices 20 and is electrically connected to a controller 66 through conductors built into the corresponding burn-in board 14 and driver/receiver board 16.

The controller 66 controls the temperature at which the liquid 34 is delivered to each semiconductor device 20 and is electrically connected to the heating element 30, the cooling element 32 and each of the pipe heating elements 56. An input device 68, such as a keyboard, is also electrically connected to the controller 66 and is used to input a desired operating temperature for each semiconductor device 20 during burn-in.

The spray nozzle arrays 28 are located in the burn-in chamber 18 which is airtight to prevent the loss of the liquid 34 during operation of the thermal control system 12. Each spray nozzle array 28 comprises a plurality of spray nozzles 70 which are oriented in a direction generally perpendicular to the corresponding socket 22.

A collection pan 74 is located near the bottom of the burn-in chamber 18 and has a drainage pipe 76 extending between a first end 78 of the pan 74 and the liquid reservoir 24. The collection pan 74 collects the run-off from the liquid 34 sprayed on the semiconductor devices 20 so that it may be returned to the liquid reservoir 24 to be recirculated. A plurality of condensation coils 80 are located in the burn-in chamber 18 near the collection pan 74 to condense any of the liquid 34 that may have undergone a phase change after coming into contact with the semiconductor devices 20.

The liquid 34 preferably comprises a perfluorinated dielectric fluid. The use of a dielectric fluid allows the liquid 34 to come into contact with the semiconductor devices 20 and their contacts without damaging the devices 20. In addition, the dielectric fluid will not damage any other electrical components on the burn-in board 14.

In operation, the pump 26 draws the liquid 34 from the liquid reservoir 24 through the first pipe section 38 and forces the liquid 34 through the second pipe section 41 into the manifold 42. The liquid 34 is then forced through the outlets 50 of the manifold 42 and into the discharge pipes 52. The temperature of the liquid 34 in each discharge pipe 52 is individually altered through the operation of a corresponding pipe heating element 56 and the thermally adjusted liquid 34 is forced through the spray nozzle arrays 28. The liquid 34 is thus sprayed onto the semiconductor devices 20 during burn-in to heat or cool the semiconductor devices 20 as desired.

A portion of the liquid 34 drawn from the liquid reservoir 24 is forced by the pump 26 through the third pipe section 54 back into the liquid reservoir 24. This helps to maintain the liquid 34 at an even temperature by continually mixing the liquid 34 over the heating and cooling elements 30,32.

During burn-in, each thermocouple 64 conveys to the controller 66 the temperature of the adjacent semiconductor device 20. The controller 66 then determines, based on the actual and desired operating temperatures of the semiconductor device 20, the temperature of the liquid 34 that must be sprayed from the corresponding spray nozzle array 28 to achieve the desired operating temperature.

The controller 66 controls the operation of the heating element 30 and the cooling element 32 to maintain the liquid 34 in the liquid reservoir 24 at a set point temperature just below that at which it is to be sprayed. The controller 66 then controls the operation of each pipe heating element 56 to individually alter the temperature of the liquid 34 provided to each spray nozzle array 28 from that of the liquid 34 in liquid reservoir 24 to the temperature necessary to achieve the desired operating temperature of the corresponding semiconductor device 20. The temperature at the semiconductor device 20 is measured by the adjacent thermocouple 64, which provides a feedback signal to the controller 66.

The liquid 34, when sprayed on the semiconductor devices 20, raises or lowers their temperature substantially to the desired operating temperature. The liquid 34 runs off of the semiconductor devices 20 and the burn-in board 14 after being sprayed and falls into the collection pan 74. The collected liquid then passes through the drainage pipe 76 back into the liquid reservoir 24 to be reused.

Some semiconductor devices have a built-in thermal sensor that automatically senses the temperature of the device. When the semiconductor devices 20 to be burned-in have this feature, the temperature of each semiconductor device 20 is provided to the controller 66 directly from the thermal sensor via conductors built into the burn-in board 14 and the driver/receiver board 16.

Although the thermal control system 12 has been described as having a single manifold 42, the thermal control system 12 can include a plurality of manifolds to further divide the liquid 34 for use with a larger burn-in system where a large number of spray nozzle arrays 28 are needed. In addition, the thermal control system 12 can have a number of valves 84 which can be used to control the flow of the liquid 34 to each spray nozzle array 28. Similar valves 84 can be used to control the flow of the liquid 34 between the pump 26 and the liquid reservoir 24. It should be noted that any desired dielectric liquid can be used in the system 12 as long as it has adequate thermal properties for heating and cooling.

Although the present invention has been described with reference to preferred embodiments, workers skilled in the art will recognize that changes may be made in form and detail without departing from the spirit and scope of the invention.

What is claimed is:

1. An apparatus for controlling the temperature of semiconductor devices in a burn-in chamber during burn-in, the apparatus comprising:

a liquid reservoir containing a liquid;

delivery means for delivering the liquid from the liquid reservoir to the semiconductor device;

a heating element and a cooling element, each attached to the liquid reservoir, for controlling the temperature of the liquid in the liquid reservoir; and a plurality of pipe heating elements attached to the delivery means, the pipe heating elements being capable of individually altering the temperature of the liquid provided to each semiconductor device.

2. The apparatus of claim 1 wherein the delivery means sprays the liquid on the semiconductor devices.

3. The apparatus of claim 2 wherein the delivery means comprises a pump, a plurality of spray nozzle arrays, and a plurality of pipes connecting the liquid reservoir to the spray nozzle arrays.

4. The apparatus of claim 1 wherein the heating element and the cooling element are attached to the liquid reservoir.

5. The apparatus of claim 1 and control means for controlling the operation of the heating element, the cooling element and the pipe heating elements.

6. The apparatus of claim 5 and temperature sensing means located adjacent to each of the semiconductor devices and electrically connected to the controller, for providing the controller with the temperatures of the semiconductor devices.

7. The apparatus of claim 3 wherein each spray nozzle array comprises a plurality of spray nozzles which are oriented generally perpendicular to a facing surface of one of the semiconductor devices.

8. The apparatus of claim 3 and a collection pan located beneath the spray nozzle arrays, the collection pan having a drainage pipe attached at one end and connected to the liquid reservoir.

9. The apparatus of claim 1 wherein the liquid comprises a dielectric fluid.

10. An apparatus for controlling the temperature of semiconductor devices during burn-in, the apparatus comprising:

a liquid reservoir having a heating element and a cooling element, the liquid reservoir containing a liquid wherein the heating element and the cooling element control the temperature of the liquid in the reservoir;

a plurality of spray nozzle arrays for spraying the liquid on the semiconductor devices;

delivery means for delivering the liquid from the liquid reservoir to the spray nozzle arrays; and a plurality of pipe heating elements attached to the delivery means for controlling the temperature of the liquid to be sprayed, the pipe heating elements being capable of individually altering the temperature of the liquid provided to each of the spray nozzle arrays.

* * * * *

UNITED STATES PATENT AND TRADEMARK OFFICE
CERTIFICATE OF CORRECTION

PATENT NO. : 5,515,910
DATED : May 14, 1996
INVENTOR(S) : Hamilton et al.

It is certified that error appears in the above-indentified patent and that said Letters Patent is hereby corrected as shown below:

Line 73, please delete "Micro Control System" and insert --Micro Control Company--.

Signed and Sealed this

Eighteenth Day of February, 1997

Attest:

BRUCE LEHMAN

*Attesting Officer*  *Commissioner of Patents and Trademarks*